United States Patent [19]

Poole

[11] Patent Number: 4,701,716
[45] Date of Patent: Oct. 20, 1987

[54] PARALLEL DISTRIBUTED SIGNAL AMPLIFIERS

[75] Inventor: Joseph J. Poole, Essex County, N.J.

[73] Assignee: RCA Corporation, Princeton, N.J.

[21] Appl. No.: 860,490

[22] Filed: May 7, 1986

[51] Int. Cl.$^4$ .......................... H03F 3/58; H03F 3/68
[52] U.S. Cl. .................................. 330/43; 330/124 R
[58] Field of Search ...................... 330/43, 124 R, 295

[56] References Cited

U.S. PATENT DOCUMENTS

| | | | |
|---|---|---|---|
| 3,426,291 | 2/1969 | Weglein et al. | 330/43 |
| 3,534,283 | 10/1970 | Seidel | 330/157 |
| 3,733,560 | 5/1973 | Oltman, Jr. et al. | 330/34 |
| 3,783,401 | 1/1974 | Oltman, Jr. | 330/56 |
| 3,873,934 | 3/1975 | Oltman, Jr. et al. | 330/56 |
| 3,873,935 | 3/1975 | Oltman, Jr. | 330/56 |
| 3,958,247 | 5/1976 | Bogner et al. | 343/754 |
| 4,016,503 | 4/1977 | Rambo | 330/124 D |
| 4,282,491 | 8/1981 | MacMaster et al. | 330/286 |
| 4,283,684 | 8/1981 | Satoh | 330/295 X |
| 4,291,278 | 9/1981 | Quine | 330/286 |
| 4,424,496 | 1/1984 | Nichols et al. | 330/286 |
| 4,477,781 | 10/1984 | Reuss, Jr. | 330/286 |
| 4,533,873 | 8/1985 | Alcock | 328/155 |
| 4,543,545 | 9/1985 | Craine et al. | 333/128 |

OTHER PUBLICATIONS

Article entitled "Ampliphase or 180 Phase Shift?" by S. N. Amos, published in the Jun. 1976 issue of Wireless World Magazine.
Jerrold Model 3880 Transistor Amplifier published by the Jerrold Electronics Corporation, (Instruction Sheet 435-674).
Jerrold Model SLE-2P Amplifier published by the Jerrold Electronics Corporation, (Instruction Sheet 435-684).
Jerrold Model SLE-300-2W Amplifier, published by the Jerrold Electronics Corporation, (Instruction Sheet 435-715-01).
Article entitled "Microwave Oscillators, Power Combiners and Measurement Techniques" by Schellenberg et al., published at pp. 164-165 of the 1978 IEEE Internation Solid-State Circuits Conference.
Article entitled "Radial Combiner Runs Circles Around Hybrids" by Sanders, published in the Nov. 1980 issue of Microwave Magazine.
Article entitled "Microwave Power Combining Techniques" by Russel, published in IEEE Transactions on Microwave Theory and Techniques, vol. MTT 27, No. 5, May 1979.

Primary Examiner—James B. Mullins
Attorney, Agent, or Firm—Clement A. Berard, Jr.; William H. Meise

[57] ABSTRACT

Two or more distributed amplifiers are paralleled to increase the available output power. Phase shifters are coupled to the amplifiers as necessary to maximize output power at a frequency. With this phase adjustment, the amplifiers may have effective electrical lengths which differ one from another by N (360°), where N is zero or an integer. Values of N other than zero undesirably reduce the instantaneous bandwidth of the paralleled amplifiers. The bandwidth is maximized by the addition of sufficient delays to reduce N to zero.

16 Claims, 7 Drawing Figures

PARALLEL DISTRIBUTED SIGNAL AMPLIFIERS

This invention relates to the paralleling of signal amplifiers to achieve higher power, and more particularly to increasing the instantaneous frequency bandwidth of paralleled travelling wave tube amplifiers.

BACKGROUND OF THE INVENTION

It is often desired to produce signal at a power level higher than can be produced by a single device. This is commonly done in audio power amplifiers, in which two (or more) tubes are combined in a parallel or in a push pull arrangement in order to double (or further increase) the output power available at a given distortion level. Push-pull operation is a form of paralleling in which harmonic distortion is cancelled, and is commonly used in high fidelity audio amplifiers and also in cable television (CATV) amplifiers.

Paralleling of multiple signal amplifier devices is very common at radio and microwave frequencies, because the physical limitations on the individual signal handling devices required by the high frequencies of operation tend to reduce the power-handling capability of the individual signal handling device. A large body of art is directed to arrangements for combining the output power of a multiplicity of microwave signal handling devices such as amplifiers. Some of these are described in the article "Miorowave Power Combininq Teohnique" by K. J. Russell, published in the IEEE Transactions on Microwave Theory and Techniques, Vol. MTT-27, No. 5, May 1979. This art is directed to the use of identical signal handling devices arranged in symmetrical structures, so that the signals arriving at the combining point are in-phase. In other cases, as in U.S. Pat. No. 4,291,278 issued Sept. 22, 1981 to Quine, the structure is not symmetrical, and phase shifters are included in order to compensate for phase differences produced by the asymmetrical structure.

It is desirable to improve the bandwidth of parallel signal amplifiers.

SUMMARY OF THE INVENTION

A paralleled system includes a first distributed amplifier with an input, an output port, and an electrical delay between the input and output ports which is greater than the duration of one wavelength at a frequency within the operating frequency range. The arrangement also includes a second distributed amplifier also having input and output port and an electrical delay between the input and output ports which is greater than the duration of one wavelength. The delay through the second amplifier may differ from the delay from the first amplifier by a delay difference corresponding to a phase shift greater than 360°. An input splitter is adapted to be coupled to a source of signals to be amplified to produce at least two input signal portions of reduced amplitude. An input coupler is coupled to the input signal splitter and to the input ports of the first and second amplifiers for coupling the first portion of the signals to be amplified to the input port of the first amplifier and for coupling the second portion of the signals to be amplified to the input port of the second amplifier. The first and second amplifiers produce first and second amplified signals, respectively, at their output ports. An output coupler is coupled to the output ports of the first and second amplifiers for combining the first and second amplified signals at a summed signal port. Phase coincidence of the first and second amplified signals within a specified phase is necessary to obtain maximum output at any frequency. The instantaneous bandwidth may be less than desired due to the excess of the delay difference. A path delay corrector is coupled to one of the input port and the output port of that amplifier which has an electrical delay which is shorter by the delay difference than the electrical delay of the other amplifier. The additional electrical delay compensates for the delayed difference. The delay between input and output ports is equalized and the phases are compensated, which produces maximum output signal with maximum instantaneous bandwidth.

DETAILED DESCRIPTION OF THE INVENTION

Figure 1:
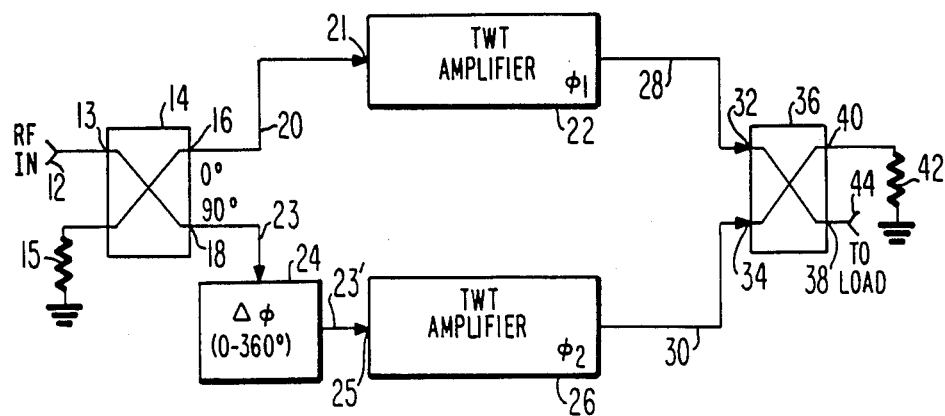
FIG. 1 is a block diagram of a prior art arrangement for paralleling travelling wave tube (TWT) amplifiers.

FIG. 1 is a block diagram of a prior art parallel travelling wave tube arrangement. In FIG. 1, signals to be amplified are applied to an input port of a 3dB, 90° hybrid coupler 14 by the way of a radio frequency (RF) input port 12. Hybrid coupler 14 produces an in-phase signal at an output port 16 and a 90° phase shifted output signal of substantially equal amplitude at an output port 18. Such hybrid couplers are well known in the art and require no further description. The in-phase signal from output port 16 is applied over a transmission line 20 to an input port 21 of a travelling wave tube (TWT) amplifier 22. The signals from output port 18 of hybrid coupler 14 are applied by way of an adjustable phase shifter 24 and transmission line portions 23 and 23' to an input port 25 of a second TWT amplifier 26. The signals applied to the input ports of amplifiers 22 and 26 are amplified and applied by way of further transmission lines 28 and 30, respectively, to input ports 32 and 34, respectively, of a further 3 dB, 90° hybrid coupler 36. Hybrid coupler 36 couples the signals applied to its input ports 32 and 34 to output ports 38 and 40. Output port 40 is coupled to a reject load 42, and output port 38 is coupled to an output terminal 44. Reject load 42 is matched to the characteristic impedance of the transmission lines and hybrid couplers.

In an arrangement such as that of FIG. 1, if the phase of the sign arriving at port 34 of coupler 36 is phase shifted by −90° (the minus signal connoting a delay) relative to the signal arriving at port 32, the signals add at output port 38 and cancel at output port 40. Any difference in amplitude between these signals arriving at ports 32 and 34 will result in a portion of energy being coupled by way of port 40 to reject load 42. That portion of the energy going to load 42 is not available for application by way of output terminal 44. to the desired load. Similarly, as the relative phase of the signals applied to ports 32 and 34 deviates from a 90° phase relationship, the power coupled to output port 38 decreases and the power coupled by way of output port 40 to reject load 42 increases until the condition in which the signal applied to port 44 leads the phase of the signal applied to port 32 by 90° (a +90° condition), at which time all the power goes to reject load 42 and none to output terminal 44. In order to set the phase in this prior art arrangement, the desired operating frequency is applied to RF input port 12, and phase shifter 24 is adjusted to maximize the power output at port 44. As a practical matter, a more sensitive adjustment minimizes the power applied to reject load 42, at which time power to output port 44 is maximized.

Figure 2:
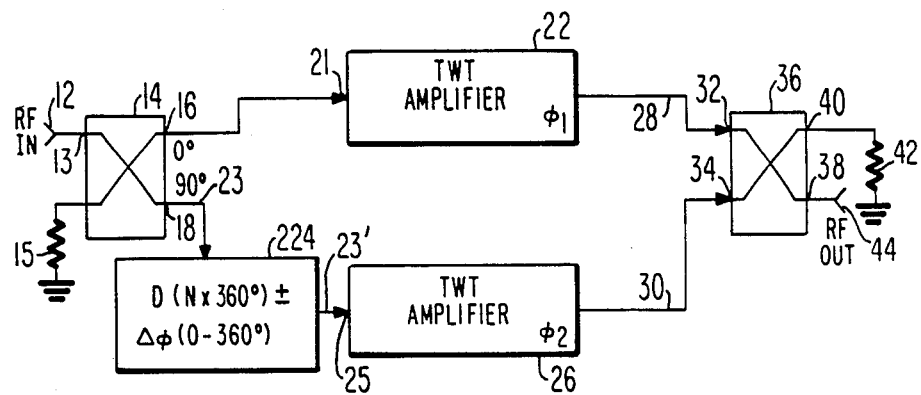
FIG. 2 is a block diagram of an embodiment of the invention.

FIG. 2 illustrates a parallel amplifier arrangement according to the invention. FIG. 2 is similar to FIG. 1, and elements of the arrangement of FIG. 2 which correspond to those of FIG. 1 are designated by the same reference numerals. It has been discovered that distributed amplifiers such as travelling wave tube amplifiers may have differences in phase which exceed 360°. In fact, otherwise identical travelling wave tube amplifiers may have path length differences of three or more wavelengths. Thus, when the phase is corrected as described in conjunction with FIG. 1 in order to maximize the output power to the desired load, path length differences of several wavelengths may exist between the two paths (one path through amplifier 22, and the other through amplifier 26). Such path length differences result in limited bandwidth.

The reduction in bandwidth due to path length differences of N (360°), where N is an integer, may be understood by considering the situation in which the phases of the signal arriving at ports 32 and 34 of output hybrid coupler 36 are in phase at a frequency of 10 GHz, but the path length through TWT amplifier 26 exceeds the path length through TWT amplifier 22 by one wavelength. It is clear that the one wavelength difference will become a two wavelength difference at 20 GHz, and will pass through a 1.5 wavelength (180°) difference condition at 15 GHz. At 15 GHz, therefore, the relative phases of the signals applied to ports 32 and 34 will be reversed. Consequently, at 15 GHz no signal will be supplied from port 38 to the utilazation terminal 44, and all the power will be dissipated in reject load 42. As the number of wavelengths of phase difference increases, the phase change with increasing frequency becomes greater. The 180° phase difference change required to go from maximum usable output to zero usable output will occur at frequencies closer to 10 GHz than 15 GHz as the number of wavelengths of delay difference increases. Path length differences of five wavelengths can reduce the instantaneous bandwidth (frequency between an output power maximum and an output power minimum) to 5%. This frequency limitation due to the paralleling is superimposed upon other frequency limitations inherent in the individual structures of the arrangement. Thus, is can be seen that any inequality of path length in a parallel system such as a travelling wave tube amplifier is extremely disadvantageous.

In accordance with the invention, phase shifter 224 is adjusted to not only create an in-phase condition of the signals at output port 38 of hybrid coupler 36 at which the signals are summed, but also to equalize path length between input port 13 of hybrid coupler 14 and output port 38 of hybrid coupler 36 by way of the paths through TWT amplifiers 22 and 26. The path length is equalized so that the path length difference is N(360°), were N=0. It should be emphasized that there is no fundamental difference between phase shifter 24 of the prior art arrangement of FIG. 1 and phase shifter 224 of the arrangement of FIG. 2 except for the alignment thereof. Phase shifts are often produced by the use of phase delay mechanisms such as transmission line lengths.

Figure 3:
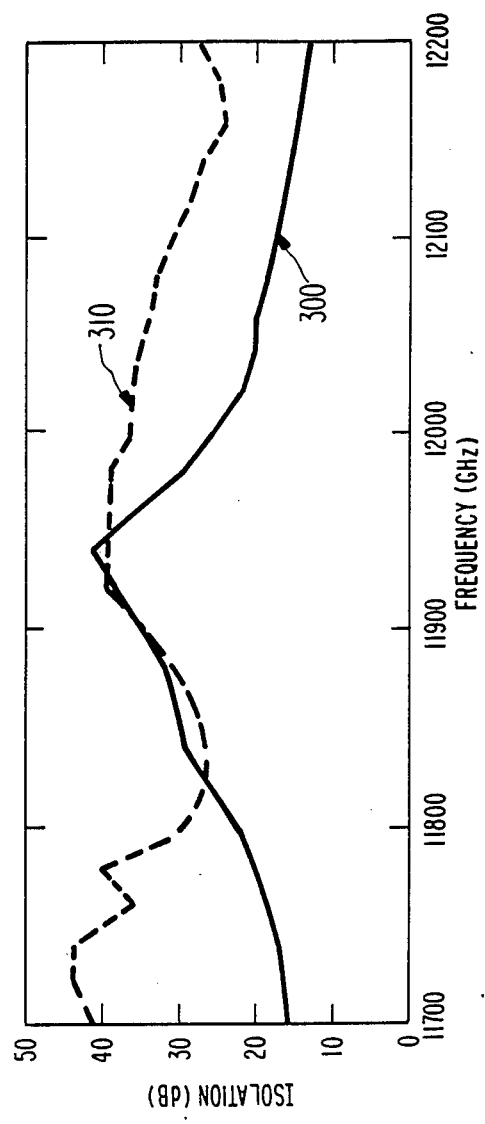
FIG. 3 is a plot illustrating the improvement in bandwidth achievable with the inventive arrangement.

As mentioned, the measurement of power coupled by way of output port 40 of hybrid coupler 36 to reject load 42 is a sensitive measure of correct phase addition at output port 38 and is an indirect measure of the signal at output port 38. A pair of TWT amplifiers was arranged with equal transmission line lengths connecting their input ports and output ports to the ports of the associated hybrid couplers. A phase adjuster such as 24 of FIG. 1 was adjusted in phase to maximize the output power at port 38 at a center frequency of 11.95 GHz. A plot of the power applied to the reject port relative to the total input power (this ratio is termed the isolation) was made and is illustrated as 300 of FIG. 3. As illustrated, plot 300 reaches a maximum of 42 dB of isolation at 11.95 GHz. The isolation progressively decreases (the relative amount of power coupled to reject load 42 increases) and reaches about 16 or 17 dB at 11.7 GHz and at 12.2 GHz. The instantaneous bandwidth for 20 dB isolation is about 280 MHz. An isolation of 20 dB corresponds to 1% of the power in the reject load and 99% available for utilization at output terminal 44. A value of 17 dB means that approximately 2% of the power is going to the reject port and 98% is coupled to terminal 44 for utilization. By contrast, a value of 40 dB means that 0.01% of the power is going to the reject port and 99.99% is being utilized. It is obviously desirable to maximize the power going to port 38 and to minimize the power flowing to port 40. Plot 310 of FIG. 3 illustrates the amount of power going to the reject load as a function of frequency in an arrangement such as that of FIG. 2 after adjustment of phase shifter 224 to both correct the phase and to compensate for the difference N(360°) in path length through amplifiers 22 and 26. As can be seen, the isolation equals or exceeds 20dB over the entire frequency range of 11700 to 12200 MHz, an instantaneous bandwidth of at least 500 MHz. This is a significant improvement in operating bandwidth.

Figure 4:
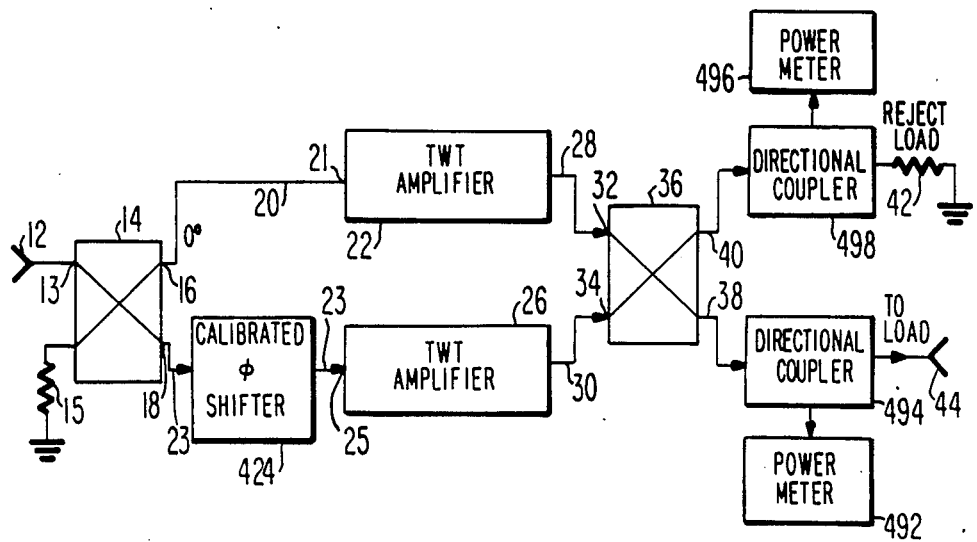
FIG. 4 is a block diagram of a paralleled arrangement using a calibrated phase shifter to determine path delay as function of frequency.

FIGS. 4–7 aid in explaining a method for establishing the number of wavelengths of delay difference in the two paths so that they may be corrected. FIG. 4 is a block diagram of an arrangement for testing the travelling wave tube amplifiers and the 3dB hybrids to be used in the system. Elements of FIG. 4 corresponding to those of FIGS. 1 and 2 are designated by the same reference number. A directional coupler 498 is coupled between output port 40 of hybrid coupler 46 and reject load 42 and is arranged to couple to a power meter 496 a sample of the power flowing to reject load 42. Similarly, a further directional coupler 494 is connected between output port 38 and the matched load (not illustrated) connected to terminal 44. Directional coupler 494 is arranged to couple a sample of the power flowing towards terminal 44 to a power meter 492. In FIG. 4, the length of transmission line 20 extending from port 16 of coupler 14 to input port of amplifier 21 is made to be electrically equal to the length of the transmission line path extending from output port 18 of coupler 14 and input port 25 of amplifier 26, including transmission line portions 23 and 23', and also including calibrated phase shifter 424. This type of equalization is known in the art, but is described briefly herein. The electrical length of a transmission line depends principally upon its dielectric material. Common dielectric materials are air, having a dielectric constant ($\epsilon$) of 1.0, polytretra-fluoroethylene (TEFLON), having $\epsilon$ of 2.1, and polyethylene ($\epsilon=2.26$). Equal physical lengths of identical transmission lines have equal electrical lengths. The electrical length (in electrical degrees $\phi$) of transmission lines if the physical length S is known is given by the expression $$\phi = S/\lambda(360°) \quad (1)$$

where $$\lambda = C/f\epsilon \quad (2)$$

and therefore $$\phi = 360° \, Sf\epsilon/C \quad (3)$$

where C is the velocity of light in vacuo (in a vacuum), f is the frequency in Hertz, and z is the relative dielectric constant of the dielectric material of the transmission line. Calibrated phase shifter 424 is conveniently a section of adjustable physical length air dielectric transmission line and transmission lines 20, 23 and 23' are preferably flexible coaxial cables having the same dielectric material. The physical length L of adjustable phase shifter 424 is made equal to $$\sqrt{\epsilon_{20}} \; (\text{length}_{20} - [\text{length 23} + \text{length 23'}]) \quad (4)$$

Figure 5:
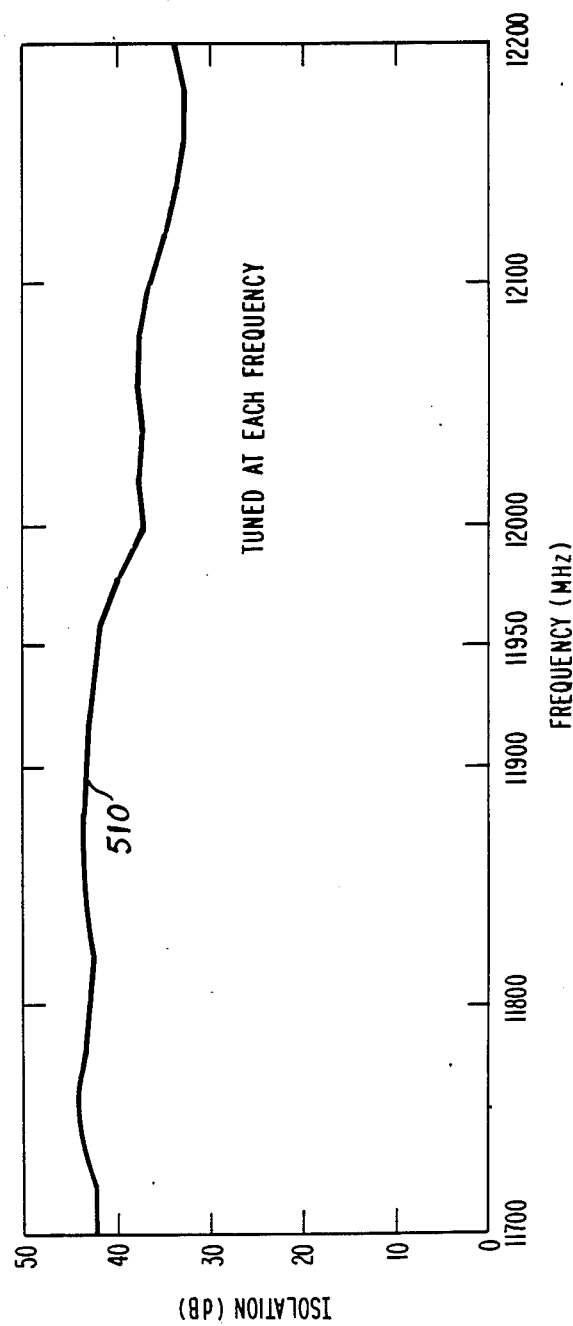
FIG. 5 is a plot of isolation versus frequency which indicates the maximum bandwidth for a particular parallel arrangement.
Figure 6:
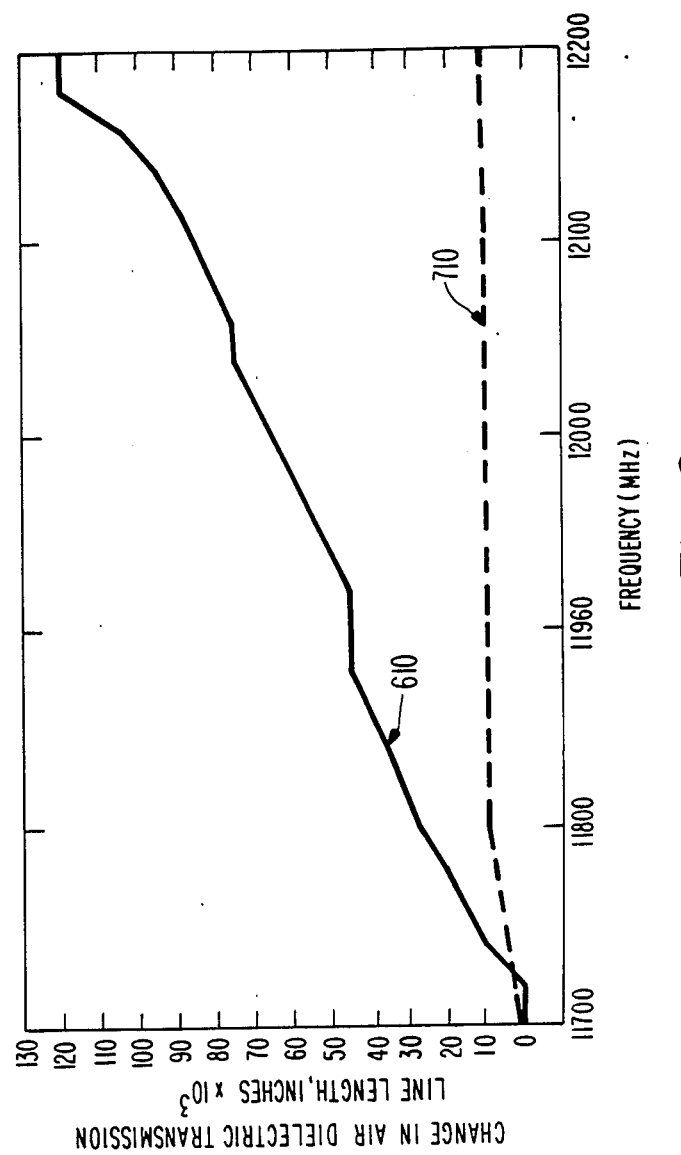
FIG. 6 is a plot of phase shifter position as a function of frequency with and without the phase compensator.

Signal is applied to input terminal 12 at a number of frequencies throughout the operating frequency range. At each frequency, calibrated phase shifter 24 is adjusted coarsely to maximize the power indicated by power meter 492, and then (as a fine adjustment) to minimize the power indicated by power meter 496. The power indicated by each meter is then noted at a number of frequencies within the operating frequency range. FIG. 5 is a plot of the ratio of the powers, in a particular test set-up. As illustrated in FIG. 5, plot 510 of the isolation (the difference between the power indicated on power meters 492 and 496, expressed in dB) is greater than 32 dB at all frequencies tested within the operating frequency range of 11.7 to 12.2 GHz. It will be noted that the value of isolation at 11.95 GHz corresponds with the isolation at 11.95 GHz in plot 300 of FIG. 3. Plot 510 of FIG. 5 is the ideal response of the parallel amplifier system tested in the arrangement of FIG. 4. With the calibrated phase shifter 424 initially set to produce a null or minimum output indication on power meter 496 at a reference frequency, the reference physical position of the phase shifter is noted. The frequency is incremented or decremented, and the phase shifter is readjusted at the new frequency to again null the indication on power meter 496. The new position of the phase shifter is noted. The frequency is once again changed incrementally, the phase shifter is readjusted for null, and its physical position is again noted. This process of adjustment and noting positions is performed at a number of frequencies with the operating frequency range. Plot 610 of FIG. 6 is a plot of the change in physical position or change in length of calibrated air dielectric phase shifter 424 of FIG. 4. This plot includes sufficient information to determine the number of wavelengths of excess delay in the system. The physical movement of the phase shifter, and its phase are a linear function of frequency. As can be seen from plot 610 of FIG. 6, a frequency change of 500 MHz (11.7 GHz to 12.2 GHz) requires 0.125 inches (3.16 millimeters) of movement to maintain the null condition of power meter 496. Equation (1) is used.

For an air dielectric transmission line phase shifter, $\epsilon = 1.0$, the distance $S = 0.125$ inch, C in vacuo equals $1.1808 \times 10^{10}$ inches/sec. Using equation (3) at the center frequency of 11.95 GHz, $$\phi = (360°)(0.125)(11.95 \times 10^9)(1.0)/1.1808 \times 10^{10}$$

$$\phi = 45.54°$$

An integral number N of wavelengths is required to compensate for this phase shift.

$$N = f\phi/360°(f_2 - f_1) \quad (5)$$

where f is the center frequency, and $f_1$ and $f_2$ are the frequencies over which $\phi$ was established.

Plugging into equation (5), $$N = (11.95 \times 10^9)(45°)/360(500 \times 10^6)$$

$$N = 2.98$$

Since it is known that any difference in effective electrical length must be an integer multiple of a wavelength, it is clear that the actual value of N must be 3, and the value of 2.98 is a result of measurement and computational errors. Thus, compensation of the system for the excess delay requires a piece of transmission line three wavelengths long at the center of the operating frequency range. The side of the paralleled amplifier system to which the additional three wavelength piece must be added is determined by whether the calibrated phase shifter became longer or shorter in order to provide plot 610 of FIG. 6. If it became shorter, TWT amplifier 26 of FIG. 4 is electrically longer than amplifier 22, and therefore the additional 3 wavelength piece of cable must be added between ports 16 and 32 of hybrid couplers 14 and 36, respectively. In FIG. 6, plot 710 shows the position of the phase shifter with the compensation added. Since the combining system is compensated, the phase shifter position does not change as a function of frequency. On the other hand, if phase shifter 424 became longer with increasing frequency, this would indicate that the path through amplifier 26 was the shorter of the two paths, and therefore the additional three wavelength piece of transmission line should be added between ports 18 and 34 of hybrid couplers 14 and 36, respectively. While the additional transmission line length may be added at the output of an amplifier, the finite loss attributable to the additional transmission line length may reduce the maximum available power applied to summing port 38. In general, it will be found to be more advantageous to add the additional cable on the input side of an amplifier.

Figure 7:
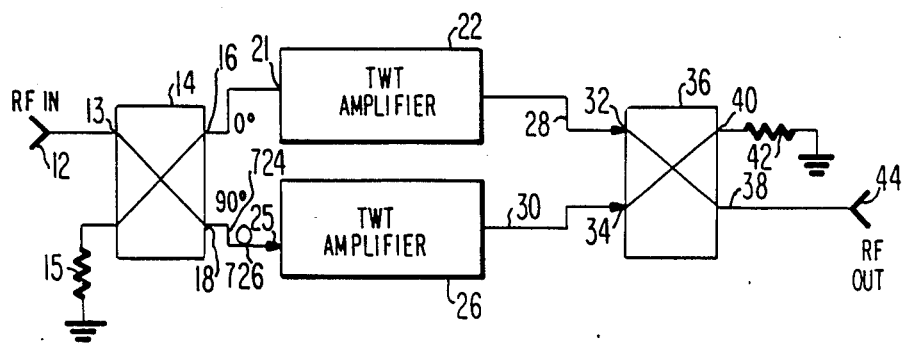
FIG. 7 is a block diagram of a paralleled amplifier arrangement having transmission path lengths selected to equalize both delay and phase at the summing point.

FIG. 7 illustrates in block diagram form the paralleled amplifier after correction. In FIG. 7, elements corresponding to those of FIG. 2 are designated by the same reference numeral. In FIG. 7, phase shifter 224 of FIG. 2, and its connecting transmission lines 23 and 23' are replaced by a single piece of transmission line 724 having the same electrical length. In order to indicate that the length of transmission line 724 is different from that of transmission line 20, a loop 726 is added. The length of transmission line 724 is the sum of the length of transmission line 20 plus N(360°) plus Δφ.

Other embodiments of the invention will be apparent to those skilled in the art. Rather than TWT amplifiers, any distributed amplifier having equivalent delays of more than one wavelength may be used, and it may even be possible to parallel different types of amplifiers. For example, in-phase input power dividers may be used to produce the signals for amplification by the amplifiers, together with in-phase power combiners for combining the amplified signals.

What is claimed is:

1. An amplifier for alternating electrical signals, comprising:
   first distributed signal amplifying means including an input port, an output port, and an electrical delay between said input and output ports which is greater than the duration of one signal alternation cycle at a frequency within the operating frequency range;
   second distributed signal amplifying means including an input port, an output port, and an electrical delay between said input and output ports which is greater than the duration of one signal alternation cycle at a frequency within the operating frequency range, but which delay may differ from said delay of said first distributed amplifying means by a delay difference corresponding to a phase shift greater than 360°;
   input signal splitting means adapted to be coupled to a source of signals to be amplified for dividing said signals to be amplified into first and second signal portions;
   input coupling means coupled to said input signal splitting means, and to said input ports of said first and second distributed signal amplifying means for coupling said first signal portion of said signals to be amplified to said input port of said first distributed signal amplifying means and for coupling said second signal portion of said signals to be amplified to said input port of said second distributed signal amplifying means, whereby first and second amplified signals appear at said output ports of said first and second distributed signal amplifying means, respectively;
   output coupling means coupled to said output ports of said first and second distributed signal amplifying means for combining said first and second amplified signals at a summed signal output port, whereby phase coincidence of said first and second amplified signals is necessary to obtain maximum summed signal output at said frequency, but the instantaneous bandwidth may be less than desired due to the excess of said delay difference; and
   path delay correction means coupled to one of said input port and said output port of that one of said first and second signal amplifying means which has electrical delay which is shorter by said delay difference than said electrical delay of the other one of said first and second amplifying means for adding an electrical delay for compensating for said delay difference, whereby said instantaneous bandwidth is increased.

2. An amplifier according to claim 1, wherein said distributed amplifying means comprises a travelling-wave amplifier.

3. An amplifier according to claim 1, wherein said distributed amplifying means comprises a travelling-wave tube.

4. An amplifier according to claim 1 wherein said input signal splitting means comprises a 3 dB, 90° hybrid coupler producing a nominal 0° phase shift of said first signal portion of said signals to be amplified and a nominal 90° phase shift of said second signal portion of said signals to be amplified.

5. An amplifier according to claim 4 wherein said output coupling means comprises a second 3 dB, 90° hybrid coupler for coupling signals applied to a first input terminal to said summed signal output port with a relative 90° phase delay and for coupling signals applied to a second input terminal to said summed signal output port with a relative 0° phase delay, said first input terminal of said second 3 dB, 90° hybrid coupler being coupled to receive said first amplified signal from said output port of said first distributed signal amplifying means, whereby the net phase delay attributable to said input signal splitting means and to said second 3 dB, 90° hybrid coupler by way of a path including said first distributed signal amplifying means is nominally 90°, said second input terminal of said second 3 dB, 90° hybrid coupler being coupled to receive said second amplified signal from said output port of said second distributed signal amplifying means, whereby the net phase delay attributable to said input signal splitting means and to said second 3 dB, 90° hybrid coupler by way of a path including said second distributed signal amplifying means is also nominally 90°, whereby phase coincidence of said first and second amplified signals occurs and maximum output occurs from said second 3 dB, 90° hybrid coupler.

6. An amplifier according to claim 5 wherein a fourth port of said second 3 dB, 90° hybrid coupler other than said first and second input terminals and said summed signal output port is terminated in a resistive load.

7. An amplifier according to claim 5 wherein said second 3 dB, 90° hybrid coupler is a waveguide 3 dB, 90° hybrid coupler.

8. An amplifier according to claim 7 wherein said path correction means is a length of coaxial transmission line coupled to said input port of that one of said first and second signal amplifying means which has a shorter electrical delay.

9. An amplifier according to claim 1 wherein said path delay correction means comprises a length of transmission line having an electrical length equal to said delay difference.

10. A power amplifier, comprising:
    signal splitting means adapted to be coupled to a source of signal to be amplified and including a first plurality of output ports at each of which divided signals appear;
    a first plurality of signal amplifiers, each including an input port coupled to an output port of said signal splitting means for receiving divided signals and an output port at which amplified signal is generated in response to said divided signals, each of said first plurality of signal amplifiers having a signal delay between its said input port and output port, the phase difference corresponding to the difference in said signal delays between two of said signal amplifiers being in excess of 360°;

signal combining means coupled to said output ports of said first plurality of signal amplifiers for combining said amplified signals from said first plurality of signal amplifiers to produce a sum signal, whereby phase coincidence within 360° of said amplified signals is necessary for producing the maximum value of said sum signal, but may not provide maximum instantaneous bandwith; and delay means coupled to said first plurality of signal amplifiers for delaying the signal through those signal amplifiers among said first plurality of signal amplifiers having said signal delay which is less than the delay of that one signal amplifier among said first plurality of said amplifiers having the greatest signal delay, said delay means being selected not only for providing phase coincidence within 360° but also for equalizing said signal delay through said first plurality of signal amplifiers whereby said sum signal and said instantaneous bandwidth are maximized.

11. A power amplifier according to claim 10 wherein said first plurality is two.

12. A power amplifier according to claim 11 wherein said signal amplifiers comprise travelling wave amplifiers.

13. A power amplifier according to claim 10 wherein said signal splitting means comprises a 3 dB, 90° hybrid coupler.

14. A power amplifier according to claim 13 wherein said signal combining means comprises a second 3 dB. 90° hybrid coupler.

15. A power amplifier according to claim 14 wherein said second 3 dB, 90° coupler is a low loss waveguide coupler.

16. A power amplifier according to claim 10 wherein said delay means comprises excess transmission line elements one less in number than said first plurality, each of said excess transmission line elements being associated with one of said first plurality of signal amplifiers other than said one signal amplifier having the greatest signal delay, for making the delay of each association of an excess transmission line element and a signal amplifier equal to the delay of said one signal amplifier having the greatest signal delay.

* * * * *